(12) United States Patent
Kim

(10) Patent No.: US 10,836,642 B2
(45) Date of Patent: Nov. 17, 2020

(54) GRAPHENE SEMICONDUCTOR DESIGN METHOD

(71) Applicant: Mee Jeong Kim, Seoul (KR)

(72) Inventor: Mee Jeong Kim, Seoul (KR)

( * ) Notice: Subject to any disclaimer, the term of this patent is extended or adjusted under 35 U.S.C. 154(b) by 0 days.

(21) Appl. No.: 16/476,963

(22) PCT Filed: Sep. 18, 2017

(86) PCT No.: PCT/KR2017/010178
§ 371 (c)(1),
(2) Date: Jul. 10, 2019

(87) PCT Pub. No.: WO2018/143532
PCT Pub. Date: Aug. 9, 2018

(65) Prior Publication Data
US 2019/0367373 A1  Dec. 5, 2019

(30) Foreign Application Priority Data

Feb. 6, 2017  (KR) .................. 10-2017-0016392

(51) Int. Cl.
| | | |
|---|---|---|
| *G06F 30/3323* | (2020.01) | |
| *C01B 32/20* | (2017.01) | |
| *H01L 21/02* | (2006.01) | |
| *H01L 29/06* | (2006.01) | |
| *H01L 29/16* | (2006.01) | |
| *H01L 29/66* | (2006.01) | |

(52) U.S. Cl.
CPC .......... *C01B 32/20* (2017.08); *G06F 30/3323* (2020.01); *H01L 21/02252* (2013.01); *H01L 29/0603* (2013.01); *H01L 29/1606* (2013.01); *H01L 29/66015* (2013.01)

(58) Field of Classification Search
USPC ............................................ 716/30
See application file for complete search history.

(56) References Cited

U.S. PATENT DOCUMENTS 9,105,791 B1 * 8/2015 Dyer .................. H01L 31/1127

FOREIGN PATENT DOCUMENTS

| | | |
|---|---|---|
| JP | 2014-164195 A | 9/2014 |
| KR | 10-2009-0090017 A | 8/2009 |
| KR | 10-2011-0128123 A | 11/2011 |
| KR | 10-2013-0076130 A | 7/2013 |
| KR | 10-2013-0131620 A | 12/2013 |

OTHER PUBLICATIONS

International Search Report dated May 15, 2018 in corresponding International application No. PCT/KR2017/010178; 5 pages.

(Continued)

*Primary Examiner* — Bryce M Aisaka
(74) *Attorney, Agent, or Firm* — Novick, Kim & Lee, PLLC; Jae Youn Kim

(57) ABSTRACT

A graphene semiconductor design method according to the present invention, designs a semiconductor of graphene material by adjusting w and an effective permittivity $\varepsilon\_eff$ of a plasmon medium by use of a resonator, and integrates graphene semiconductor by adjusting a feed direction of a plasmon medium to generate a meta substance and a surface plasmon resonance phenomenon.

5 Claims, 4 Drawing Sheets

(56) References Cited

OTHER PUBLICATIONS

R. Marque's, "Left-Handed-Media Simulation and Transmission of EM Waves in Subwavelength Split-Ring-Resonator Loaded Metallic Waveguides", Physical Review Letters, pp. 1-4, vol. 89, No. 18, Oct. 2002., 4 pgs.
David K. Cheng, "Fundamentals of Engineering Electromagnetics", pp. 322, 1997., 3 pgs.
Kim, Mi Jung al., "Miniaturized Antenna Using a Planar Möbius Strip Bisected Along the Circumferential Direction", Microwave Conference, 2006. 36th European, Sep. 10, 2006, pp. 827-829, 4 pgs.
Notification of Reason for Refusal dated Feb. 27, 2019 in corresponding Korean application No. 10-2017-0016392; 4 pgs.
Grant of Patent dated Mar. 28, 2019 in corresponding Korean application No. 10-2017-0016392; 2 pgs.

* cited by examiner

GRAPHENE SEMICONDUCTOR DESIGN METHOD

FIELD

The present invention relates to a graphene semiconductor design method, and more particularly to a graphene semiconductor design method to which the Doppler effect and plasmon resonance are applied.

BACKGROUND

In 2004, the success of taking out graphene from graphite by using transparent tape at room temperature has led to the development of various technologies using graphene.

Graphite has a structure in which a plane forms layers, in which carbon is arranged like a hexagonal mesh of honeycomb shape. A layer of this graphite is called graphene.

FIG. 1 is an illustration view of graphene.

Graphene has a thickness of 0.2 nm and a quite high physical and chemical stability. In particular, graphene conducts electricity 100 times or more than copper, and has mobility of electrons 100 times faster than that of silicon which is mainly used as a semiconductor. The strength of graphene is 200 times stronger than steel and more than twice as high as diamond with its highest thermal conductivity. In addition, since graphene transmits most of the light, it is transparent and quite excellent in elasticity such that it does not lose its electrical properties even if it is increased or bent.

The fields of utilization of such graphene are quite diverse. That is, ultrafast semiconductors that use high electrical characteristics of graphene, bending displays that use transparent electrodes, computers that operate only with displays, high-efficiency solar cells that use high conductivity, etc. are exemplified. In particular, the graphene can make displays that can be bent, computers attached to people's wrists and electronic papers, and is attracting attention as new materials for the future.

Due to these characteristics, graphene is evaluated as a material exceeding a carbon nanotube which is famous as a next-generation new material. Hence, it is called "dream nanomaterial."

Graphene and carbon nanotubes have quite similar chemical properties, and they can separate metallicity and semi-conductivity through post-processing. However, since the graphene has more uniform metallic than carbon nanotubes, the graphene is more likely to be applied industrially.

[Non-patent Literature 1] R. Marque's, "Left-Handed-Media Simulation and Transmission of EM Waves in Sub-wavelength Split Ring Resonator-Loaded Metallic Waveguides", Physical Review Letters, pp. 1-4, vol. 89, No. 18, October 2002.

[Non-patent Literature 2] David K. Cheng, "Fundamentals of Engineering Electromagnetics", pp. 322, 1997.

SUMMARY

However, the graphene has no band gap, and has the characteristics of metal instead of the characteristics of semiconductor.

There is a demand for the development of graphene semiconductor design technology by applying such the characteristics of the graphene.

The present invention has been made given such circumstances, and an object thereof is to provide a graphene semiconductor design method to which the Doppler effect is applied.

Another object of the present invention is to provide a graphene semiconductor design method which can integrate graphene semiconductors by applying surface plasmon resonance phenomenon.

In order to achieve the above object, a graphene semiconductor design method according to the present invention, designs a semiconductor of graphene material by adjusting w and an effective permittivity $\varepsilon\_\text{eff}$ of a plasmon medium by use of a resonator, and integrates graphene semiconductor by adjusting a feed direction of a plasmon medium to generate a meta substance and a surface plasmon resonance phenomenon.

According to the graphene semiconductor design method regarding the present invention as described above, it is possible to design a semiconductor of a graphene material by adjusting w and the effective permittivity $\varepsilon\_\text{eff}$ of the plasmon medium by the use of a resonator.

According to the present invention, it is possible to obtain the effect that the graphene semiconductor can be integrated by adjusting the feed direction of the plasmon medium to generate the meta substance and the surface plasmon resonance phenomenon.

DETAILED DESCRIPTION

Hereinafter, a graphene semiconductor design method according to a preferred embodiment of the present invention will be described in detail with reference to the attached figures.

The effective permittivity in an artificial plasmon medium is derived as in Equation 1 by the Doppler effect.

$$\varepsilon_{\mathit{eff}} = \varepsilon_0 \left(1 - \frac{\omega_p^2}{\omega_0^2}\right) \quad \text{[Equation 1]}$$

Here, $\varepsilon\_0$ is a vacuum permittivity, $\omega\_p$ is a plasmon angular frequency, and $\omega\_0$ is a traveling wave angular frequency.

That is, $\omega\_0$ is the angular frequency of the energy source wave at the feed point.

When traveling wave radiates toward to the plasmon medium and away from the receiver by adjusting the position of feed point, Equation (1) is modified as shown in Equation (2).

$$\varepsilon_{\mathit{eff}} = \varepsilon_0 \left(1 + \frac{\omega_p^2}{\omega_0^2}\right) \quad \text{[Equation 2]}$$

The graphene plasmon medium operates as an insulator by enhancing the effective permittivity of the plasmon medium of graphene material.

If σ>>ωε, the medium is called a good conductor; and if σ<<ωε, the medium is called a good insulator. Here, σ is electrical conductivity, ω is angular frequency, and ε is permittivity.

If the loss tangent σ/ωε is 1.8*10^4 or more, it is called a good conductor; and if α/ωε is 1.8*10^4 or less, it is called a good insulator.

In the present invention, the semiconductor of graphene material is designed by adjusting w and the effective permittivity ε_eff of the plasmon medium by the use of the resonator.

Semiconductor design of graphene materials applies resonators and plasmon media with increased effective permittivity.

Resonators of the graphene material operating at low frequency operate as insulators, and resonators of the graphene material operating at high frequency operate as conductors.

In addition, if a plasmon medium having an increased effective permittivity is applied, the insulation of the graphene resonator is enhanced.

In the present invention, the surface plasmon resonance phenomenon is applied to integrate the graphene semiconductors.

The surface plasmons mentioned above refer to similar particles that collectively vibrate on the surface of a thin metal film. In metal nanoparticles, while the light in the visible light band and the plasmon are combined, light absorption occurs, and it gets bright colors.

The surface plasmon resonance phenomenon refers to a state of surface plasmon that has been excited by light incident on a flat surface, which is used in standard measurement principles to measure the degree of adsorption of a sample on a metal surface or on metal nanoparticles.

If only the feed direction of the plasmon medium is changed, then it becomes a meta-material, and a surface plasmon resonance phenomenon occurs.

Figure 1:
FIG. 1 is an illustration view of graphene.
Figure 2:
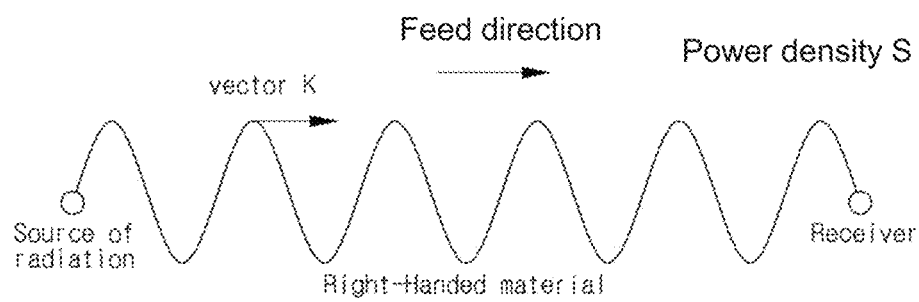
FIG. 2 illustrates a traveling wave and a Poynting vector for a substance having a positive effective permittivity.
Figure 3:
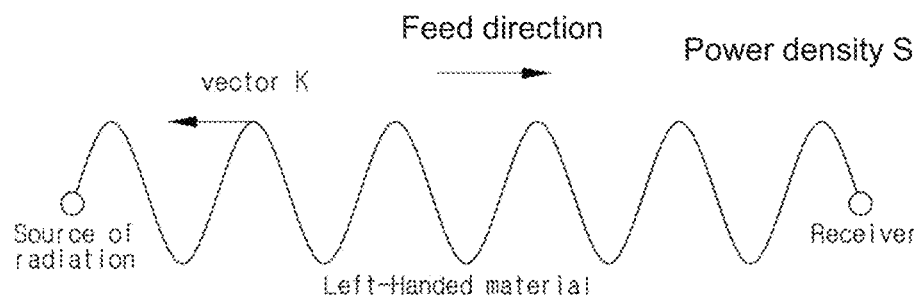
FIG. 3 illustrates a traveling wave and a Poynting vector for a substance having a negative effective permittivity.

For example, FIGS. 2 and 3 are diagrams illustrating traveling waves and Poynting vectors with a substance having a positive substance and a negative substance, respectively.

In a medium with positive effective permittivity (Right-Handed Material), the radiation direction of the traveling wave, that is, the Poynting vector K is directed in the same direction as the feed direction of the current, as illustrated in FIG. 2.

On the other hand, in a medium with negative effective permittivity, the Poynting vector K of the traveling wave is directed in the opposite direction to the feed direction of the current in a meta-material, as illustrated in FIG. 3.

That is, in the present invention, the feed direction of the current can be selectively determined, so that the effective permittivity of the plasmon medium becomes positive or negative.

Figure 4:
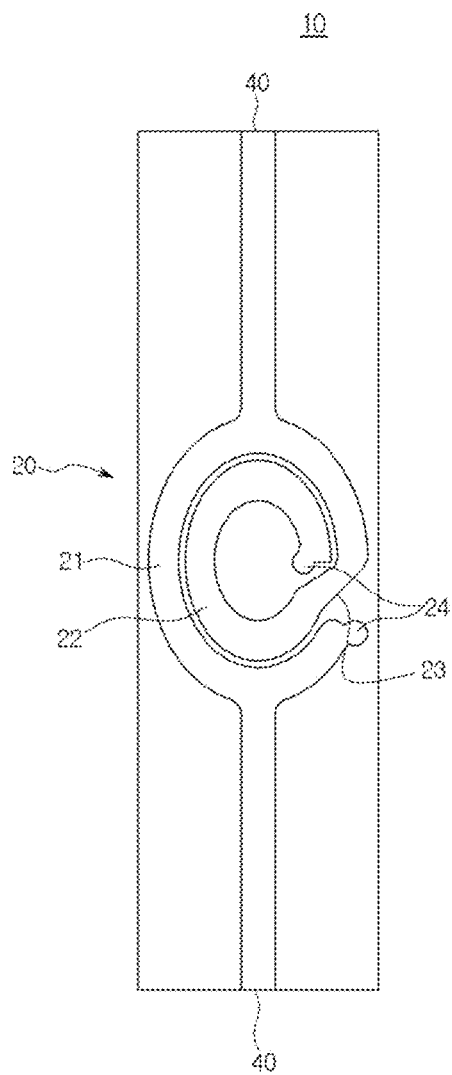
FIG. 4 is a block diagram of a resonator to which a graphene semiconductor design method according to a preferred embodiment of the present invention is applied.

FIG. 4 is a configuration diagram of a resonator to which a graphene semiconductor design method according to a preferred embodiment of the present invention is applied.

A resonator (10), to which a graphene semiconductor design method according to a preferred embodiment of the present invention is applied, comprises a receiver (20) disposed on the front surface of a genetic material substrate (11) as illustrated in FIG. 4, and feed lines (30) connected to upper and lower portions of the receiver (20), respectively.

A source of radiation (40) is provided at the outer end of each feed line (30).

For example, the receiver (20) sequentially comprises a plurality of loops (21, 22) formed of a structure in which the Moebius Strip is cut at least one or more along the circumference, and one end of each loop (21, 22) and a second bridge (not shown) connecting via holes (24) respectively formed at one end of the innermost loop (22) and the outermost loop (21).

That is, in order to minimize the line coupling effect phenomenon which is a problem of the flat type Moebius Strip, in the present invention, a bridge connecting the inner space in which the two rings intersect to the outer space is provided on the front and back of the substrate connect to the via hole after physical separation.

The present invention changes the feed direction of the current so that the radiation direction of the traveling wave is directed toward the plasmon medium and away from the receiver by changing the position of the feed point located on the feeding line to the via hole. Thereby, it is possible to have a positive effective permittivity.

On the other hand, the present invention forms a feed point at the outer end of the feed line on both sides, deforms the feed direction of current so that the radiation direction of the traveling wave is directed to the receiver, and gives a negative effective permittivity, then be able to generate a meta substance.

By applying such a quasi-Moebius Strip structure, the present invention minimizes the line coupling effect from low frequencies, and the electromagnetic wave interference phenomenon that can be serious as the RF circuit can becomes smaller at the same resonance frequency.

Of course, the present invention is not necessarily limited to this, and may be changed to a resonator to which radiators of various shapes and structures are applied.

When the surface plasmon resonance phenomenon occurs between the air and the conductor, the physical wavelength of the resonator is minimized to the nanometer level.

As described above, according to the present invention, the graphene semiconductor can be integrated by adjusting the feed direction of the plasmon medium to generate the meta substance and the surface plasmon resonance phenomenon.

Through the above processes, the present invention can design the semiconductor of graphene material by adjusting angular frequency ω and the effective permittivity ε_eff of the plasmon medium at the resonance period.

Then, according to the present invention, the graphene semiconductor can be integrated by adjusting the feed direction of the plasmon medium to generate the meta substance and the surface plasmon resonance phenomenon.

It should be understood that the exemplary embodiments described therein should be considered in a descriptive sense only and not for purposes of limitation. Descriptions of features or aspects within each embodiment should typically be considered as available for other similar features or aspects in other embodiments.

Through the above process, the present invention can design the semiconductor of graphene material by adjusting angular frequency ω and the effective permittivity ε_eff of the plasmon medium by use of the resonator.

What is claimed is:

1. A graphene semiconductor design method, comprising:
   a design step which designs a semiconductor of graphene material by adjusting angular frequency ω and effective permittivity ε_eff of a plasmon medium by use of a resonator disposed on a front surface of a dielectric substrate, the resonator including a radiator and a feed line respectively connected to upper and lower portions of the radiator; and an integration step which generates surface plasmon resonance phenomenon by adjusting a feed direction of the plasmon medium to generate a meta substance and thereby integrates the graphene semiconductor.

2. The graphene semiconductor design method according to claim 1, wherein when a position of the feed point changes such that a direction of radiation of a traveling wave is directed away from a receiver and towards the plasmon medium, the effective permittivity ε_eff of the plasmon medium is modified as follows:

$$\varepsilon_{\mathit{eff}} = \varepsilon_0 \left( 1 + \frac{\omega_p^2}{\omega_0^2} \right)$$

wherein ε_0 is dielectric permittivity of vacuum, ω_p is plasma angular frequency, ω_0 is traveling wave angular frequency.

3. The graphene semiconductor design method according to claim 2, wherein the plasmon medium operates as an insulator when the effective permittivity increases, and the plasmon medium operates as a conductor if σ>>ω_ε, while the plasmon medium operates as the insulator if σ<<ω_ε, wherein σ is electrical conductivity, ω is each frequency, ε is permittivity.

4. The graphene semiconductor design method according to claim 2,
wherein when applying the graphene material, the resonator operates as an insulator at a low frequency lower than a first frequency and operates as a conductor at a high frequency higher than a second frequency set higher than the first frequency, and
wherein when the effective permittivity of the plasmon medium is increased, an insulating property is increased.

5. The graphene semiconductor design method according to claim 4, wherein when a surface plasmon resonance phenomenon occurs in the plasmon medium, a physical wavelength of the resonator is minimized in nanometer units.

* * * * *